United States Patent [19]

Periot

[11] 4,415,945
[45] Nov. 15, 1983

[54] DETECTOR APPARATUS OF THE TWO-TERMINAL TYPE SUPPLIED WITH RECTIFIED A.C. POWER THE VOLTAGE OF WHICH CAN VARY IN A WIDE RANGE, WITH LOAD CONTROL BY SWITCHING THYRISTORS

[75] Inventor: Jean-Marie Periot, Isle d'Espagnac, France

[73] Assignee: La Telemecanique Electrique, France

[21] Appl. No.: 331,718

[22] Filed: Dec. 17, 1981

[30] Foreign Application Priority Data

Dec. 31, 1980 [FR] France .................. 80 27871

[51] Int. Cl.³ ............................................. H02H 3/08
[52] U.S. Cl. .................................................. 361/100
[58] Field of Search .................... 361/94, 98, 100, 101

[56] References Cited

U.S. PATENT DOCUMENTS 4,348,709  9/1982  Mauk et al. .................. 361/100 X

FOREIGN PATENT DOCUMENTS 2415305  10/1975  Fed. Rep. of Germany ...... 361/100

*Primary Examiner*—Harry E. Moose, Jr.
*Attorney, Agent, or Firm*—William A. Drucker

[57] ABSTRACT

A detector apparatus of the two-terminal type supplied with rectified A.C. power ($e_1$, $e_2$, $v_1$ $v_2$, $D_7$–$D_{10}$) the voltage of which can vary in a wide range, for controlling a series-connected load (CH), including at least one thyristor ($TH_1$) and a Zener diode ($Z_3$), a detector-control circuit assembly (CAP) associated with the load, the output (s) of which biases the base of a first transistor ($T_1$), a capacitor ($C_5$) serving as a power supply for the detector control circuit (CAP), and means for protection against overloads, which include a MOS-type transistor ($T_3$), a second transistor ($T_2$) connected to the grid of said MOS transistor, and a differential amplifier (A) connected in series with the base of said first transistor ($T_1$).

8 Claims, 1 Drawing Figure

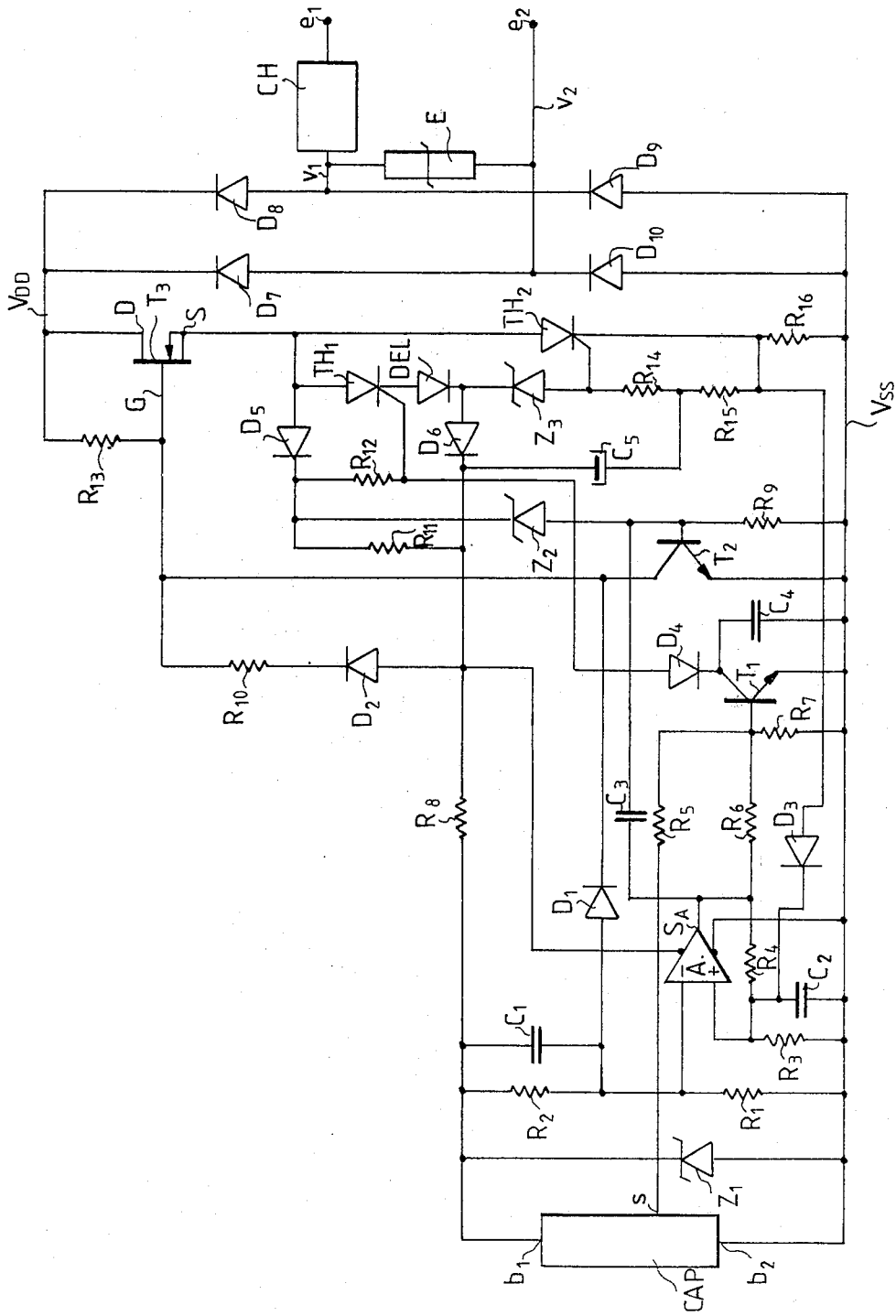

DETECTOR APPARATUS OF THE TWO-TERMINAL TYPE SUPPLIED WITH RECTIFIED A.C. POWER THE VOLTAGE OF WHICH CAN VARY IN A WIDE RANGE, WITH LOAD CONTROL BY SWITCHING THYRISTORS

BACKGROUND OF THE INVENTION

The invention relates to detector apparatus of the two-terminal type supplied with rectified AC power and including a sensor associated with a control circuit, which apparatus are series-connected with the load to be controlled, and more particularly it relates to apparatus the supply voltage of which can vary in a wide range, e.g. from about 20 V to about 240 V, and to supply means, means for controlling the output current, and means for protecting against overloads or shorts, which are incorporated in such apparatus.

As an example, the apparatus may be a proximity or presence detector having a photocell, of the capacitive or other type.

In such apparatus, the load control is frequently carried out by gating at least one thyristor whenever the diode provides a control signal, which causes a current, so called output current, having an intensity sufficient to control the load, to flow through the load in the circuit.

These apparatus generally include, in addition to the sensor and the control circuit, means for rectifying the A.C current feeding the apparatus, resistors which are series-connected with the sensor-control circuit assembly and through with the latter is fed whenever the load is in its off-state, and at least one Zener diode connected across said assembly and in series with the thyristor so as to define a reference voltage.

In such a type of apparatus, it is important not to disturb the load operation by reducing the voltage across the apparatus whenever the load is being controlled. The voltage across the apparatus, then so-called "waste voltage", must be as low as possible. Furthermore, since an apparatus of this kind must operate under quite variable supply voltages, e.g. from about 20 V to about 240 V, it is necessary to control the current flowing through the circuit whenever the load is off so that its value remains negligible and substantially constant whichever is the above-defined supply voltage; this current is then referred to as "residual current".

THE PRIOR ART

One of the drawbacks of prior art apparatus is that, whenever the thyristor is fired, its control can only be taken over when the current flowing therethrough is near zero. This does not allow the circuit to be protected whenever either an overload or short occurs while a load control order is provided by the sensor and thence the thyristor is conducting current.

OBJECT OF THE INVENTION

The object of the invention is to overcome this drawback by providing a detector apparatus of the two-terminal type including means for generating a control signal from information provided by a sensor, supply means series-connected with a load to be controlled, providing a rectified A.C current the voltage of which may vary in a wide range, and means for controlling the load, which are connected both to said supply means and to said control signal generating means, said load controlling means including at least one thyristor and a Zener diode which are series-connected in reverse directions, a transistor having an input electrode, an output electrode and a control electrode, means for connecting the thyristor gate to said transistor input electrode, means for connecting the thyristor input electrode to the cathode of said Zener diode, means for connecting the thyristor output electrode to the anode of said Zener diode, means for connecting the control electrode of the transistor to the output of the said means for generating a control signal, a capacitor, means for connecting said capacitor to the cathode of said Zener diode, and means for connecting said capacitor to the anode of said Zener diode, whereby said capacitor serves as a power supply for said control signal generating means whenever the rectified current flowing through the apparatus takes its minimum value, said load controlling means further comprising means for limiting the intensity of the current through the apparatus, including a high-gain solid state component which is series-connected with said thyristor, and a differential amplifier the output of which is connected to said transistor control electrode, whereby said differential amplifier and solid state component are so connected that the transistor, which is normally blocked whenever a control order is provided by said control signal generating means, becomes saturated upon any overload or short and thence blocks the thyristor.

In order to provide a residual current which is as low as possible and substantially constant, while supplying the apparatus with a voltage which can be selected within a wide range, the invention provides a second transistor which is series-connected with said control input of said solid state component and the base of which is, on one hand connected to the output of said differential amplifier, and, on the other hand, biased through a bridge consisting of a Zener diode and a resistor.

In order to achieve a waste voltage which is as low as possible, the invention also provides a second thyristor connected in series with said solid state component and in parallel with the first-mentioned thyristor and said Zener diode which are series-and opposition-connected.

DESCRIPTION OF THE PREFERRED EMBODIMENT

The various features and the advantages of the invention will become evident from the following disclosure taken in combination with the accompanying single drawing which shows a diagram of an apparatus of the two-terminal type in accordance with a preferred embodiment of the invention.

The circuit as shown in the appended drawing is supplied with AC voltage through a pair of supply terminals $e_1$ and $e_2$ connected to a full-wave rectifier bridge, consisting of diodes $D_7$–$D_{10}$, through a pair of supply lines $v_1$ and $v_2$, respectively, with one of which ($v_1$) is series-connected a load CH, e.g. a relay. The rectifier bridge $D_7$–$D_{10}$ provides at its output a rectified voltage which feeds the remainder of the circuit through a pair of supply lines $v_{DD}$ (positive pole) and $V_{SS}$ (negative pole).

A CAP assembly consisting of a diode and a load control circuit and including, e.g. a phototransistor, has a pair of supply terminals, namely a positive terminal $b_1$ and a negative terminal $b_2$, and an output s. This assembly is fed by said diode bridge through a transistor $T_3$, which may advantageously be of the MOS-type and the drain of which is directly connected to line $V_{DD}$ and the source of which is connected to positive terminal $b_1$ of the CAP assembly through a diode $D_5$, a resistor $R_{11}$ and a resistor $R_8$, while terminal $b_2$ is directly connected to $V_{SS}$. Transistor $T_3$ is biased through a resistor $R_{13}$ connected between $T_3$ emitter and $V_{DD}$.

The other end of $T_3$ emitter is connected to $V_{SS}$ through a transistor $T_2$, e.g. of the NPN-type, via its collector-emitter junction, its collector being connected to $V_{SS}$.

$T_3$ source is connected to $V_{SS}$ via $D_5$ through an opposition-connected Zener diode $Z_2$ and a resistor $R_9$ series-connected with $Z_2$, $T_2$ base being connected to the circuit path connecting $Z_2$ anode to $R_9$. $T_3$ source is also connected to $V_{SS}$ through a first thyristor $TH_1$ the cathode of which is connected to a light-emitting diode DEL serving to signal the on- or off-state of CH, at the anode thereof, DEL cathode being connected to a Zener diode $Z_3$ having a Zener voltage lower than $Z_2$ and which is in opposition and connected to $V_{SS}$ through three series-connected resistors $R_{14}$, $R_{15}$ and $R_{16}$, $R_{14}$ being connected to $Z_3$ anode and $R_{16}$ being connected to $V_{SS}$.

A second thyristor $TH_2$ which is connected in parallel with $TH_1$, DEL, $Z_3$ and resistors $R_{14}$ and $R_{15}$ is provided for connecting $T_3$ source to $V_{SS}$ through $R_{16}$. $TH_2$ gate is connected to $Z_3$ anode.

A Zener diode $Z_1$ is connected in parallel with terminals $b_1$ and $b_2$, its cathode being connected to $b_1$, and thus limits the voltage which can be applied to CAP assembly.

Output s biases, through a resistor bridge $R_5$, $R_7$ wherein $R_5$ is connected to s and $R_7$ is connected to $V_{SS}$, the base of a transistor $T_1$, e.g. of the NPN-type, the emitter of which is directly connected to $V_{SS}$ and the collector of which is connected to $V_{DD}$ through, in this order, $V_{DD}$, $T_3$, $D_5$, a resistor $R_{12}$ and a diode $D_4$ the cathode of which is connected to $T_1$ collector. $D_4$ anode is, on one hand, as herein above stated, connected to $R_{12}$ and, on the other hand, connected to $TH_1$. $T_1$ collector is connected to $V_{SS}$ through a capacitor $C_4$.

A capacitor $C_5$ serving as a supply storage for CAP assembly is connected both to the connecting point of resistors $R_{14}$ and $R_{15}$, and to terminal $b_1$ of CAP assembly through $R_8$. A diode $D_6$ the anode of which is connected to DEL cathode and the cathode of which is connected to that $C_1$ terminal which is connected to $R_8$ allows $C_1$ to be charged. Capacitor $C_5$ is connected to $T_3$ grid through a diode $D_2$ connected in series with a resistor $R_{10}$. Resistor $R_{10}$ is connected to $T_3$ grid and $D_2$ anode is connected to that $C_1$ terminal which is connected to $R_8$.

The circuit also includes an operational amplifier A having a positive supply terminal connected to $V_{DD}$ through $R_{11}$, $D_5$ and $T_3$, and a negative supply terminal directly connected to $V_{SS}$. Operational amplifier A also has a pair of inputs "+" and "−", respectively, and an output $S_A$.

The "−" input of A is connected to a resistor bridge $R_2$, $R_1$, connected in parallel across terminals $b_1$, $b_2$ of CAP assembly, whereby resistor $R_2$ is connected to $b_1$ and resistor $R_1$ is connected to $b_2$, thence to $V_{SS}$. The "+" input of A is connected both to $V_{SS}$ through a resistor $R_3$ and to output $S_A$ of A through a resistor $R_4$. Output $S_A$ is in turn connected to $T_1$ base through a resistor $R_6$ and to $T_2$ base through a capacitor $C_3$. A diode $D_3$ provides connection between a resistor $R_{16}$, which is not connected to $V_{SS}$, and the "+" input of A, $D_3$ cathode being connected to said "+" input and being also connected to $V_{SS}$ through a capacitor $C_2$. A capacitor $C_1$ is connected in parallel with $R_2$ and its charging is provided through a diode $D_1$ the anode of which is connected to that $C_1$ terminal which is connected to the "−" input of amplifier A and the cathode of which is connected to $T_2$ collector.

Finally, a non-linear resistor E is connected between A.C. power supply lines $v_1$ and $v_2$ downstream load CH.

Whenever the load (CH) is in its off-state, i.e. no load control order is detected by the detector of CAP assembly, transistor $T_3$ is biased by $R_{13}$ and used as a current generator. Its source is maintained at a constant potential set through a Zener diode $D_2$ the biasing current of which is limited by a resistor $R_9$ series-connected with $Z_2$. The current intensity through $T_3$ is controlled through auxiliary or second transistor $T_2$, which allows to maintain at low, minimum valve the current through the load where there is a voltage of varying amplitude at terminals $e_1$ and $e_2$, thus preventing this current from disturbing CH operation. A portion of the current generated by $T_3$ serves to feed the CAP assembly the voltage accross which is maintained constant by means of Zener diode $Z_1$. The remaining portion of the current generated by $T_3$ flows through $T_1$, which is maintained in its saturated state since the bias provided at the output thereof has adjusted itself to such effect.

Whenever the detector of the CAP assembly receives a load control order, the order is transmitted to output s of the CAP assembly, which blocks $T_1$. The current provided by $T_3$ then charges capacitor $C_4$ through $R_{12}$ and $D_4$ until $TH_1$ gate reaches the potential necessary to fire $TH_1$. $TH_1$ then goes into its conducting state and in turn charges $C_5$ until the potential difference across $C_5$ becomes equal to $Z_3$ Zener voltage, which is lower than that of $Z_2$. Once $C_5$ is charged, Zener diode $Z_3$ becomes conducting and the current flowing through $Z_3$ generates across resistors $R_{14}$ and $R_{15}$ a potential difference sufficient to bias $TH_2$ gate so as to render $TH_2$ conducting. $TH_2$ then short-circuits $TH_1$, DEL and $Z_3$, as well as resistors $R_{14}$ and $R_{15}$, thus reducing the waste voltage of the circuit upon occurence of a voltage drop through the diode bridge, increased with voltage drops through $T_3$, $TH_2$ and $R_{16}$. Resistances of $R_{14}$ and $R_{15}$ are so selected that the potential increase across $R_{15}$ resulting from $C_5$ charging current is not sufficient, under normal operating conditions, to bias $TH_2$ gate and fire $TH_2$, whereas the potential increase across $R_{14}$ and $R_{15}$ in series, whenever $Z_3$ passes current, is sufficient to fire $TH_2$. This explains that $TH_2$ will become fired only when $Z_3$ is conducting current.

Whenever $TH_2$ is conducting current, $T_3$ source is substantially brought down to the circuit low potential and $T_3$ grid biasing is then provided by capacitor $C_5$ which feeds the grid through $D_2$ and $R_{10}$. $T_3$ saturation is thus provided in spite of the low waste voltage. Capacitor $C_5$ also serves as a power supply storage for CAP assembly whenever $TH_2$ is conducting current since the voltage across the bridge is not sufficient at this time. Through $R_{16}$ flows a current substantially equal to the whole current flowing through $T_3$ since the current derived by $R_8$ and CAP assembly is negligible. The voltage across $R_{16}$ thus indicates at all times the intensity of the current through the load. The potential difference across $R_{16}$ is applied through $D_3$ to the "+" input of operational amplifier A.

In normal operation, i.e. in the absence of any overload, this potential is lower than the one applied to the "−" terminal through resistor bridge $R_1$, $R_2$ and output $S_A$ is substantially at the circuit low potential.

Whenever an overload condition occurs, the current through $T_3$ increases, resulting in a corresponding increase of the potential difference across $R_{16}$, and thence of the potential of the "+" input. The latter potential then becomes greater than that of the "−" input, which causes A to switch over. A voltage equal to the supply voltage of the differential amplifier then appears at $S_A$. Such a change in $S_A$ potential causes $C_3$ to be charged through $R_9$. The charging current generates across $R_9$ a sufficient potential difference to bias $T_2$ base, so that $T_2$ becomes saturated, as a result of which $T_3$ source is brought to a potential substantially equal to the circuit low potential, and thus $T_3$ becomes blocked. $T_2$ is kept saturated as long as the $C_3$ charging current generates a sufficient potential difference across $R_9$. $T_3$ blocking induces $TH_1$ and $TH_2$ blocking since no current flows therethrough.

While at this time the potential difference across $R_{16}$ is zero, A output is maintained at the same level as the circuit supply voltage because the "+" input potential is maintained greater than the "−" input potential through resistor bridge $R_3$, $R_4$ since resistances of $R_1$, $R_2$, $R_3$ and $R_4$ have been selected to such effect. Also, capacitor $C_1$ becomes charged upon switching of its output $S_A$ through $T_2$ whenever the latter is saturated. Thus, $C_1$ helps to maintain A locking whenever such locking is provided by resistor bridge $R_3$, $R_4$ upon blocking of $TH_1$ and $TH_2$.

The occurence of a voltage at $S_A$ results in $T_1$ switching to its saturated state since its base is connected to $S_A$ through resistor $R_6$. The circuit then operates as hereinabove described when no control order is provided. The current through the load becomes eventually limited to the current flowing through $T_1$ and the CAP assembly.

In order to put the circuit again into operation, the unlocking of A will be achieved either by disconnecting one of the supply lines $v_1$ and $v_2$ of the apparatus, or by increasing the potential of A "−" input to a potential greater than its "+" input potential.

The above-described circuit thus effectively provides protection of the apparatus against overloads and shorts, when the load is being controlled, by reducing the current flowing through the circuit to the residual current level.

By using a MOS-type transistor, it is possible to provide a control circuit consuming only a negligible power with respect to the current through the load, thus not disturbing operation of the latter. Indeed, the grid current necessary to control the MOS transistor is in the range of a hundred nanoamperes (from 100 to 200 nA), whereas the current through the transistor channel can reach intensities in the range of one ampere. Another feature of MOS transistors is that they can bear voltages up to several hundred volts. Such a feature allows use of a transistor of this kind in circuits the supply voltage of which can vary in a substantial range (e.g., about 20 V R.M.S. to about 240 V R.M.S.). In the device according to the invention, both features have been used. Indeed, the MOS-type transistor serves as a power source with a varying voltage, in normal operation, and helps to protect the circuit in case of an overload or a short-circuit, while consuming only a very low current for control thereof. Thus, the proposed device consumes only little power for the control portion of its operation, which is one of the desired goals in a circuit of this kind.

When the control order provided by the detector of the CAP assembly fires thyristor $TH_1$ while there is a load short-circuit, diode DEL and capacitor $C_5$ could be destroyed if protecting means of the overall circuit were set to operate with current levels greater than those permissible for these two components. In order to prevent such a destruction, the resistance of $R_{15}$ is so selected that the potential difference across it be sufficiently high to cause $TH_2$ firing whenever a current the level of which is close the permissible limit of both $C_5$ and DEL flows through $R_{15}$, since $TH_2$ derives current as above described.

Non-linear resistor E provides protection of the apparatus against overloads of inductive origin which may occur across load CH upon blocking of transistor $T_3$ when CH includes inductances.

The above-described circuit thus effectively provides a two-terminal apparatus the waste voltage of which is low in normal operation, by use of a second thyristor, and which is protected against overloads and shorts by control of the current intensity through the thyristors, by means of the differential amplifier associated with the MOS-type transistor. This circuit also has the advantage to protect those circuit components for which the permissible current level is lower than the level for which the protection has been designed, in case of firing during a load short-circuit, by putting the second thyristor into operation, which results in a derivation therethrough of the current which could have destroyed said components. Finally, by using $T_3$ as a power source, the apparatus can operate in a voltage range, e.g. from 20 to 240 V A.C. since the current feeding the internal circuits of the apparatus, which is provided by $T_3$, is constant and independent from said voltage.

It should be understood that the above-described circuit may be embodied in various forms without departing from the scope of the invention; as an example, the MOS-type transistor can be replaced with a high-gain power Darlington circuit; however, as the gain thereof is lower than the gain of the MOS-type transistor, the current level required to control it will be higher.

I claim:

1. A detector apparatus for controlling the flow of current through a load in dependence with information provided by a sensor, said detector apparatus comprising:
    (i) signal generating means (CAP) for generating an output signal from the said information, said signal generating means having first ($b_1$) and second ($b_2$) power supply inputs and a signal output (s);
    (ii) first and second power supply terminals ($e_1 e_2$), the detector apparatus having first and second terminals, the first terminal of the apparatus being connected to the first power supply terminal ($e_1$) through the load and the second terminal of the apparatus being connected to the second power supply terminal ($e_2$);
    (iii) rectifier means ($D_7$–$D_{10}$) having a pair of input terminals connected accross the first and second terminals of the apparatus and a pair of output terminals and first ($V_{DD}$) and second ($V_{SS}$) power supply lines connecting the respective output terminals of the rectifier means to the respective power supply inputs ($b_1b_2$) of the signal generating means;

(iv) a high gain solid state component ($T_3$) having a source (S), a drain (D) and a gate (G), said drain being connected to the first power supply line ($V_{DD}$) and said gate being connected to the first power supply ($V_{DD}$) of the rectifier means through a biasing resistor ($R_{13}$);

(v) circuit means, including a first thyristor ($TH_1$) having a gate and a Zener diode ($Z_3$) connected in series and in opposition, said circuit means connecting the source (S) of the said high gain solid state component ($T_3$) to the second power supply line ($V_{SS}$), said Zener diode ($Z_3$) having an anode and a cathode;

(vi) a transistor ($T_1$) having an input electrode, and output electrode which is connected to the said second power supply line ($V_{SS}$) and a control electrode; and means ($D_4$) for connecting the gate of the said first thyristor ($TH_1$) to the said input electrode;

(vii) differential amplifier means (A) having first and second inputs and an output, the output of the said differential amplifier means being connected to the control electrode of the said transistor ($T_1$), a resistor bridge ($R_1R_2$) connecting the power supply inputs ($b_1$–$b_2$) of the signal generating means to the first input of the differential amplifier means, and first resistance means ($R_3$) connecting the second power supply line ($V_{SS}$) to the second input of the differential amplifier means;

(viii) a first capacitor ($C_5$); means ($D_6$) for connecting said capacitor to the cathode of the Zener diode ($Z_3$), means ($R_{14}$) for connecting said first capacitor to the anode of the Zener diode ($Z_3$), and means ($R_8$) connecting the capacitor to the first power supply input ($b_1$) of the signal generating means;

(ix) means ($R_{14}R_{15}R_{16}D_3$), connecting the anode of the Zener diode ($Z_3$) to the second input of the differential amplifier means, whereby the said transistor ($T_1$) which is normally blocked whenever the signal generating means provide an output signal, becomes saturated upon occurrence of an overload or short through the load, and consequently, the said first thyristor ($TH_1$) is blocked.

2. A detector apparatus as claimed in claim 1, wherein second resistance means ($R_4$) connect the second input and the output of the said differential amplifier means and the said means connecting the anode of the Zener diode ($Z_3$) to the second input of the differential amplifier means include third resistance means ($R_{14}R_{15}R_{16}$) whereby the output of the said differential amplifier means switches from a first potential level to a second potential level substantially higher than the first potential level upon occurrence of an overload or short through the load, the said second potential level being sufficient for causing the said transistor to become saturated.

3. A detector apparatus as claimed in claim 2, wherein the said resistor bridge includes a first resistor ($R_2$) connecting the first power supply input ($b_1$) of the signal generating means and a second capacitor ($C_1$) is connected accross the said first resistor ($R_2$).

4. A detector apparatus as claimed in claim 1, further including a second transistor ($T_2$) having an input electrode, an output electrode and a base, the output electrode of said second transistor being connected to the second power supply line ($V_{SS}$), the input electrode of said second transistor being connected to the gate of said high gain solid state component ($T_3$), and means ($C_3$) connecting the base of said second transistor to the output of said differential amplifier means.

5. A detector apparatus as claimed in claim 4, wherein biasing bridge means, including a further Zener diode ($Z_2$) and a resistor ($R_9$) connected between the source of the said high gain solid state component ($T_3$) to the second power supply line ($V_{SS}$), are linked to the base of the said second transistor ($T_2$).

6. A detector apparatus as claimed in claim 1, said apparatus further comprising a second thyristor ($TH_2$) having an anode, a cathode and a gate, the anode of said second thyristor ($TH_2$) being connected to the source of said high gain solid state component ($T_3$), the gate of said second thyristor being connected to the anode of the said Zener diode ($Z_3$) and the cathode of the said second thyristor ($TH_2$) being connected to the said second power supply line ($V_{SS}$) through a resistor ($R_{16}$).

7. A detector apparatus as claimed in claim 6, wherein the anode of the said Zener diode is connected to the second power supply line ($V_{SS}$) through first and second serially connected resistors ($R_{14}R_{15}$), having a junction point, the first capacitor ($C_5$) is connected to the said junction point, and the resistor ($R_{16}$) which connects the cathode of the second thyristor ($TH_2$) to the second power supply line ($V_{SS}$) is connected to the said second resistor ($R_{15}$).

8. A detector apparatus as claimed in claim 1, wherein the said high gain solid state component ($T_3$) is a MOS transistor.

* * * * *